(12) United States Patent
Ishii

(10) Patent No.: US 9,897,659 B2
(45) Date of Patent: Feb. 20, 2018

(54) SECONDARY BATTERY CHARGE STATUS ESTIMATION DEVICE AND SECONDARY BATTERY CHARGE STATUS ESTIMATION METHOD

(71) Applicant: SANYO Electric Co., Ltd., Osaka (JP)

(72) Inventor: Yohei Ishii, Osaka (JP)

(73) Assignee: SANYO ELECTRIC CO., LTD., Osaka (JP)

(*) Notice: Subject to any disclaimer, the term of this patent is extended or adjusted under 35 U.S.C. 154(b) by 192 days.

(21) Appl. No.: 14/778,585

(22) PCT Filed: Jan. 31, 2014

(86) PCT No.: PCT/JP2014/000512
§ 371 (c)(1),
(2) Date: Sep. 19, 2015

(87) PCT Pub. No.: WO2014/155921
PCT Pub. Date: Oct. 2, 2014

(65) Prior Publication Data
US 2016/0216336 A1    Jul. 28, 2016

(30) Foreign Application Priority Data
Mar. 28, 2013   (JP) ................................ 2013-070209

(51) Int. Cl.
*H02J 7/00* (2006.01)
*G01R 31/36* (2006.01)
*H01M 10/48* (2006.01)

(52) U.S. Cl.
CPC ..... *G01R 31/3637* (2013.01); *G01R 31/3624* (2013.01); *G01R 31/3651* (2013.01);
(Continued)

(58) Field of Classification Search
CPC ............ G01R 31/3624; G01R 31/3637; G01R 31/3651; G01R 31/3662; H01M 10/48; H02J 7/0021
See application file for complete search history.

(56) References Cited

U.S. PATENT DOCUMENTS

| 6,285,163 B1 | 9/2001 | Watanabe et al. |
| 2009/0033285 A1 | 2/2009 | Tomura et al. |

(Continued)

FOREIGN PATENT DOCUMENTS

| JP | 2004-271342 | 9/2004 |
| JP | 2009-036635 | 2/2009 |

(Continued)

OTHER PUBLICATIONS

International Search Report of PCT application No. PCT/JP2014/000512 dated Apr. 8, 2014.

*Primary Examiner* — Vuthe Siek
(74) *Attorney, Agent, or Firm* — McDermott Will & Emery LLP

(57) ABSTRACT

Charge state estimation device includes: current/voltage acquiring unit for acquiring a charge/discharge current value and inter-terminal voltage value of secondary battery; combined current calculating unit for calculating a combined current value from the charge/discharge current value acquired at a time t; estimation time setting unit for setting, as an estimation time for charge state estimation, the time at which the combined current value exists within a predetermined threshold range; internal resistance estimating unit for estimating the internal resistance value of secondary battery on the basis of the inter-terminal voltage values and charge/discharge current values of secondary battery at the estimation time T and at sampling time before the estimation time; and charge state estimating unit for estimating the open circuit voltage value and charge state value of the secondary (Continued)

battery on the basis of the inter-terminal voltage value of secondary battery at the estimation time and the internal resistance value.

4 Claims, 6 Drawing Sheets

(52) U.S. Cl.
CPC ........ G01R 31/3662 (2013.01); H01M 10/48 (2013.01); H02J 7/0021 (2013.01)

(56) References Cited

U.S. PATENT DOCUMENTS

| | | | | |
|---|---|---|---|---|
| 2010/0085057 | A1* | 4/2010 | Nishi | G01R 31/3624 324/427 |
| 2010/0250163 | A1* | 9/2010 | Maegawa | G01R 31/3624 702/63 |

FOREIGN PATENT DOCUMENTS

| | | |
|---|---|---|
| JP | 2011-215151 | 10/2011 |
| WO | 1999/061929 | 12/1999 |

\* cited by examiner

SECONDARY BATTERY CHARGE STATUS ESTIMATION DEVICE AND SECONDARY BATTERY CHARGE STATUS ESTIMATION METHOD

This application is a U.S. national stage application of the PCT international application No. PCT/JP2014/000512.

TECHNICAL FIELD

The present invention relates to a charge state estimation device and charge state estimation method for estimating the charge state of a secondary battery that is repeatedly charged or discharged in a short time.

BACKGROUND ART

In order to prevent the over-discharge or overcharge of a secondary battery, the state of charge (SOC) as the charge state value is estimated. For estimating SOC, a current integrating method of momentarily integrating the charge current value and discharge current value of the secondary battery is employed. Furthermore, Patent Literature 1 discloses the following charge state estimation device of a secondary battery. The charge state estimation device has a condition where, in order to stabilize the product of the internal resistance and the current, the limit current is increased when the internal resistance is low and the temperature of the secondary battery is high. Under this condition, the charge state estimation device assumes that the secondary battery is stable when the charge/discharge current is the limit current or less, and sets the inter-terminal voltage in the stable state as the open circuit voltage (OCV).

Patent Literature 2 discloses an estimating means of a battery charge state and a battery degradation estimating method. In the means and method, it is taken into consideration that the current-voltage characteristic of a secondary battery has a large hysteresis and the internal resistance increases with the degradation. In this disclosure, the SOC estimated by the current integrating method is set as a pseudo SOC, an estimated OCV corresponding to the pseudo SOC is denoted with Voc, and Voc is added to a dynamic voltage variable component Vdyn considering the hysteresis and a voltage component Vr due to the internal resistance, thereby providing (Voc+Vdyn+Vr). The pseudo SOC is corrected to the SOC corresponding to this equation.

CITATION LIST

Patent Literature

PTL 1: Unexamined Japanese Patent Publication No. 2011-215151
PTL 2: International Patent Publication WO99/61929

SUMMARY OF THE INVENTION

An in-vehicle secondary battery or a secondary battery used for an Ancillary service is repeatedly charged and discharged in a short time. Even in this case, it is desired to accurately estimate the charge state of the secondary battery.

The charge state estimation device of a secondary battery of the present invention is a charge state estimation device for estimating a charge state value SOC of a secondary battery that is repeatedly charged and discharged in a short time. The charge state estimation device includes the following components:

a current/voltage acquiring unit for acquiring a charge/discharge current value and inter-terminal voltage value of a secondary battery at a predetermined sampling time interval;

a combined current calculating unit for calculating, by a predetermined current combining method, a combined current value $Iw(t)$ from a charge/discharge current value $I(t)$ acquired at a time t in consideration of the charge/discharge state before the time t;

an estimation time setting unit for setting, as an estimation time for charge state estimation, the time $t=T$ at which the combined current value $Iw(t)$ exists within a predetermined threshold range;

an internal resistance estimating unit for estimating an internal resistance value R of the secondary battery on the basis of the inter-terminal voltage value $V(T)$ and charge/discharge current value $I(T)$ of the secondary battery at the estimation time T and the inter-terminal voltage value $V(T-n)$ and charge/discharge current value $I(T-n)$ of the secondary battery at a sampling time $(T-n)$ before the estimation time T; and a charge state estimating unit for estimating an open circuit voltage value Voc of the secondary battery on the basis of the inter-terminal voltage value $V(T)$ of the secondary battery at the estimation time T and the internal resistance value R, and estimating a charge state value SOC of the secondary battery on the basis of a Voc-SOC relation showing the relationship between the previously determined open circuit voltage value Voc and charge state value SOC.

The charge state estimation method of a secondary battery of the present invention is a charge state estimation method for estimating a charge state value SOC of a secondary battery that is repeatedly charged and discharged in a short time. The charge state estimation method includes the following steps of:

acquiring a charge/discharge current value and inter-terminal voltage value of a secondary battery at a predetermined sampling time interval;

by a predetermined current combining method, calculating a combined current value $Iw(t)$ from the charge/discharge current value $I(t)$ acquired at a time t in consideration of the charge/discharge state before the time t;

setting, as an estimation time for estimating the charge state, the time $t=T$ at which the combined current value $Iw(t)$ exists within a predetermined threshold range;

estimating an internal resistance value R of the secondary battery on the basis of the inter-terminal voltage value $V(T)$ and charge/discharge current value $I(T)$ of the secondary battery at the estimation time T and the inter-terminal voltage value $V(T-n)$ and charge/discharge current value $I(T-n)$ of the secondary battery at a sampling time $(T-n)$ before the estimation time T (here, n is a natural number of 1 or more); and estimating an open circuit voltage value Voc of the secondary battery on the basis of the inter-terminal voltage value $V(T)$ of the secondary battery at the estimation time T and the internal resistance value R, and estimating a charge state value SOC of the secondary battery on the basis of a Voc-SOC relation showing the relationship between the previously determined open circuit voltage value Voc and charge state value SOC.

Thanks to the above-mentioned configuration, by using the combined current value considering the preceding charge/discharge state, SOC is estimated on the basis of the inter-terminal voltage of the secondary battery when the combined current value exists within a predetermined threshold range. Thus, even when the current value varies or the charge and discharge are repeated in a short time, the charge state of the secondary battery can be accurately estimated.

DESCRIPTION OF EMBODIMENTS

An example of the exemplary embodiment of the present invention is described hereinafter in detail with reference to the accompanying drawings. The sampling interval, combination coefficient, charge/discharge current value, inter-terminal voltage value, and Voc-SOC relation (which are described later) are examples for description, and can be appropriately modified in accordance with the specification of the secondary battery and charge state estimation device. Hereinafter, corresponding elements in all drawings are denoted with the same reference marks, and the duplication of the descriptions is omitted.

Figure 1:
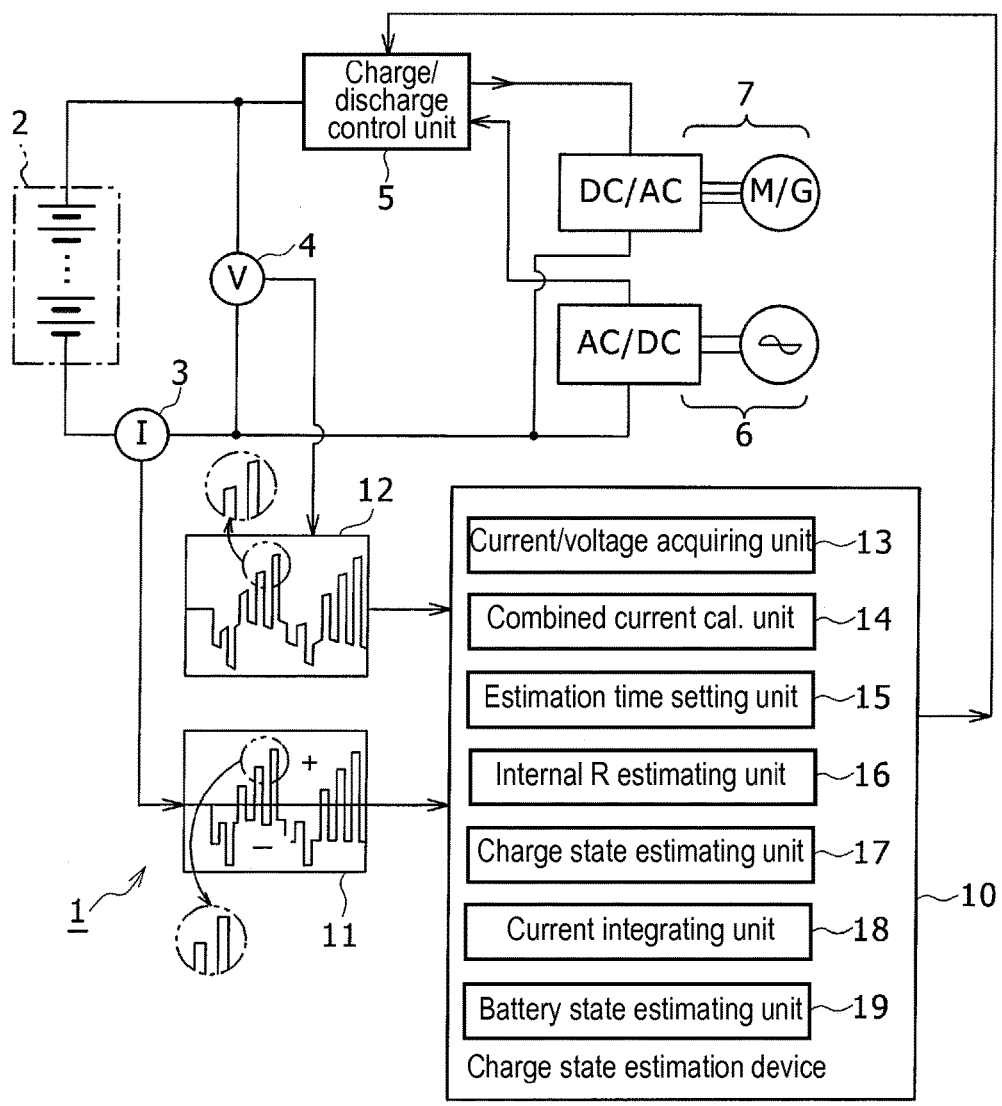
FIG. 1 is a block diagram of a charge/discharge system of a secondary battery using a charge state estimation device in an example in accordance with an exemplary embodiment of the present invention.

FIG. 1 is a block diagram of charge/discharge system 1 of a secondary battery. Charge/discharge system 1 includes secondary battery 2, current detecting unit 3 for detecting the charge/discharge current value of secondary battery 2, voltage detecting unit 4 for detecting the inter-terminal voltage value of secondary battery 2, charge/discharge control unit 5 for controlling the charge and discharge of secondary battery 2, charge power source 6 connected to charge/discharge control unit 5, discharge load 7, and charge state estimation device 10 for estimating the charge state of secondary battery 2.

Secondary battery 2 is a battery module formed by combining a plurality of chargeable/dischargeable cells. As such secondary battery 2, a battery module formed by interconnecting a plurality of lithium-ion cells in series and in parallel is employed. Each lithium-ion cell has an inter-terminal voltage of 3.0 V to 4.0 V and a capacity of 2.9 Ah. For example, secondary battery 2 formed by interconnecting 100 lithium-ion cells in series has an inter-terminal voltage of about 300 V to about 400 V. A battery module formed by interconnecting 10 secondary batteries 2 in parallel has a capacity of 29 Ah. This is an example for description, and another characteristic value may be employed. As secondary battery 2, a battery module formed by combining nickel-metal-hydride cells, a battery module formed by combining alkaline cells, or a battery module formed by combining lead acid storage cells may be employed.

Current detecting unit 3 is a current detecting means for distinctly detecting the charge current input from charge power source 6 to secondary battery 2 and the discharge current output from secondary battery 2 to discharge load 7. As current detecting unit 3, an appropriate ammeter can be employed. The charge/discharge current value detected by current detecting unit 3 is transmitted to charge state estimation device 10 through an appropriate signal line. Here, a current value having a plus sign is a charge current value, and a current value having a minus sign is a discharge current value.

Voltage detecting unit 4 is a voltage detecting means for detecting the inter-terminal voltage of secondary battery 2. As voltage detecting unit 4, an appropriate voltmeter can be employed. The inter-terminal voltage value detected by voltage detecting unit 4 is transmitted to charge state estimation device 10 through an appropriate signal line.

Charge/discharge control unit 5 is a controller for controlling the charge and discharge of secondary battery 2 in response to requests from charge power source 6 and discharge load 7. A charge state value SOC or the like of secondary battery 2 is momentarily transmitted to charge/discharge control unit 5 from charge state estimation device 10. Therefore, charge/discharge control unit 5 controls the charge and discharge of secondary battery 2 on the basis of the charge state value SOC or the like so that secondary battery 2 does not undergo over-discharge or overcharge. For example, charge/discharge control unit 5 performs the following control. When there is a possibility that the charge state value SOC of secondary battery 2 decreases to cause the over-discharge, charge power source 6 is connected to secondary battery 2. When there is a possibility that the charge state value SOC of secondary battery 2 increases to cause the overcharge, discharge load 7 is connected to secondary battery 2. In this case, in response to requests from charge power source 6 and discharge load 7, charge/discharge control unit 5 controls secondary battery 2 so that the charge and discharge are repeated in a short time.

As an example, the case where charge/discharge system 1 is used for an Ancillary service is taken. In this case, a line controller that is disposed outside FIG. 1 and controls the Ancillary service detects a load variation (namely, demand variation of power) of a power transmission/distribution network, and commands charge/discharge control unit 5 to keep the supply-demand balance of the whole power transmission/distribution network. Then, charge/discharge control unit 5 issues a command to charge power source 6 and secondary battery 2, and charge and discharge are performed. This command is momentarily issued to keep the supply-demand balance. The command is issued every 1 s, for example.

As another example, the case is taken where secondary battery 2 is mounted in a vehicle and is connected to a rotary electric machine via a driving circuit such as an inverter circuit. In this case, the rotary electric machine has a function of an electric motor serving as discharge load 7, and a function of a power generator serving as a charge power source. Therefore, depending on the travel state of the vehicle, the rotary electric machine sometimes serves as discharge load 7, or, conversely, sometimes serves as charge power source 6. In response to the travel state of the vehicle, charge/discharge control unit 5 repeatedly performs the functions in a short time.

Thus, charge/discharge control unit 5 controls secondary battery 2 so that the charge and discharge are repeated in a short time in response to the requests from charge power source 6 and discharge load 7.

Charge power source 6 is formed of a commercial power source and an AC/DC converter. Instead of the commercial power source, or together with it, a solar battery may be used as a power generating device. In this case, charge power source 6 is formed by connecting a DC/DC converter to the solar battery. When the rotary electric machine mounted in the vehicle functions as a power generator, charge power source 6 is formed of the rotary electric machine.

Discharge load 7 is formed of a three-phase synchronous type rotary electric machine and a DC/AC converter. Instead of the three-phase synchronous type rotary electric machine, or together with it, an electric lamp load or the like may be used as a load device. When the electric lamp load is a DC electric lamp, discharge load 7 is formed by connecting a DC/DC converter to the DC electric lamp.

Charge state estimation device 10 estimates the charge state value SOC and battery state value SOH (State of Health) of secondary battery 2 on the basis of the detected value by current detecting unit 3 and the detected value by voltage detecting unit 4, which have been transmitted. In this case, in response to the operation in which charge/discharge control unit 5 controls secondary battery 2 so that the charge and discharge are repeated in a short time, charge state estimation device 10 accurately estimates the charge state value SOC of secondary battery 2 even during the charge/discharge control.

FIG. 1 also shows charge/discharge current waveform 11 detected by current detecting unit 3 and inter-terminal voltage waveform 12 detected by voltage detecting unit 4. Both of these waveforms vary in a short time in response to the charge/discharge control repeated in the short time by charge/discharge control unit 5. The comparison between charge/discharge current waveform 11 and inter-terminal voltage waveform 12 is shown below. Charge/discharge current waveform 11 has a square wave because charge/discharge control unit 5 performs the charge/discharge control in response to change of the current command value. Inter-terminal voltage waveform 12 has a waveform obtained by deforming the tip of a square wave because secondary battery 2 has a relaxation time characteristic.

Charge state estimation device 10 includes the following components:

current/voltage acquiring unit 13 for acquiring a charge/discharge current value and an inter-terminal voltage value of secondary battery 2;

combined current calculating unit 14 for calculating, by a predetermined current combining method, a combined current value $Iw(t)$ from a charge/discharge current value $I(t)$ acquired at a time t; and estimation time setting unit 15 for setting, as an estimation time for charge state estimation, the time $t=T$ at which the combined current value $Iw(t)$ exists within a predetermined threshold range.

Charge state estimation device 10 further includes the following components:

internal resistance estimating unit 16 for estimating an internal resistance value R of secondary battery 2 on the basis of the inter-terminal voltage value $V(T)$ and charge/discharge current value $I(T)$ of secondary battery 2 at the estimation time T and the inter-terminal voltage value $V(T-n)$ and charge/discharge current value $I(T-n)$ of secondary battery 2 at a sampling time $(T-n)$ before the estimation time T (here, n is a natural number of 1 or more); and charge state estimating unit 17 for estimating an open circuit voltage value Voc of the secondary battery on the basis of the inter-terminal voltage value $V(T)$ of secondary battery 2 at the estimation time T and the internal resistance value R, and estimating the charge state value SOC of the secondary battery on the basis of the Voc-SOC relation showing the relationship between the previously determined open circuit voltage value Voc and charge state value SOC.

Charge state estimation device 10 further includes current integrating unit 18 for calculating an integrated current amount by integrating the detected current value, and battery state estimating unit 19 for estimating a battery state SOH (State of Health) using a plurality of SOC estimation results and the integrated current value acquired at the timing of the SOC estimation. The full charge capacity corresponding to charge state value SOC=100% varies depending on the operation state of secondary battery 2. The SOH is used for distinguishing the operation state. SOH=100% indicates the state of the full charge capacity in the initial state of secondary battery 2.

Such functions can be achieved when charge state estimation device 10 executes software. Specifically, these functions can be achieved when charge state estimation device 10 executes a charge state estimation program. A part of the functions may be achieved by hardware.

Figure 2:
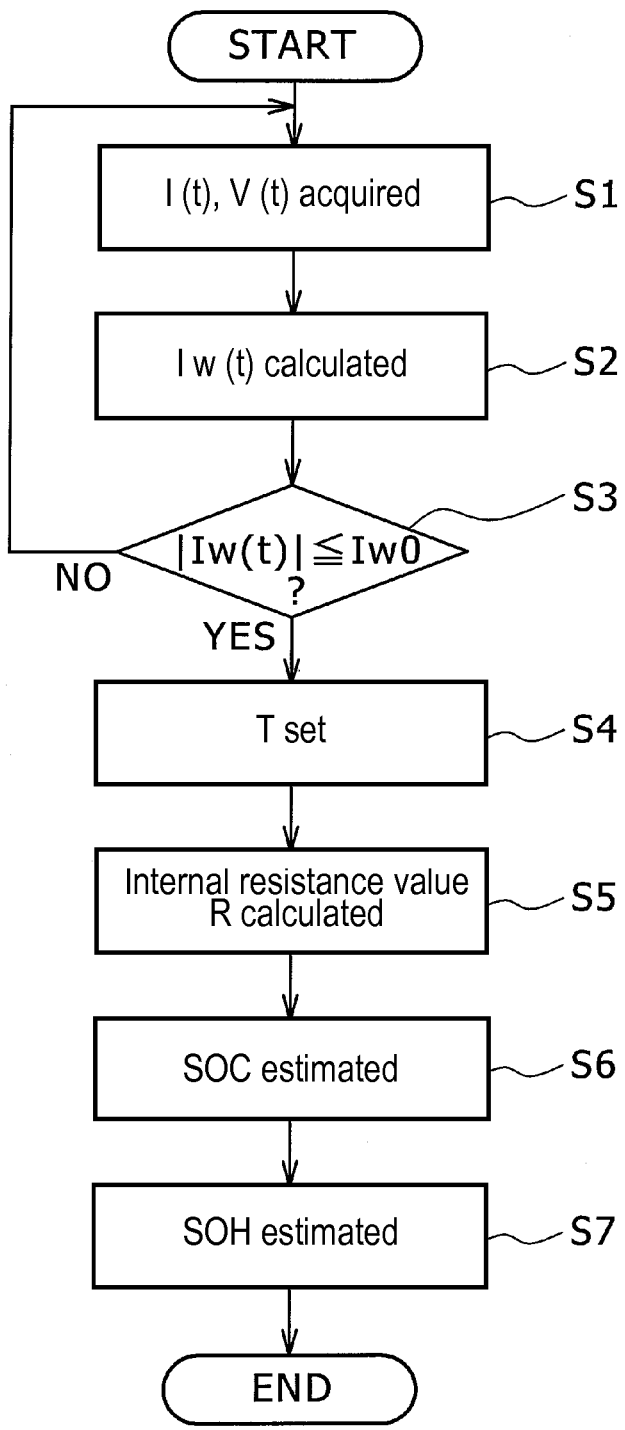
FIG. 2 is a flowchart showing the procedures of a charge state estimation method in the example in accordance with the exemplary embodiment of the present invention.
Figure 3:
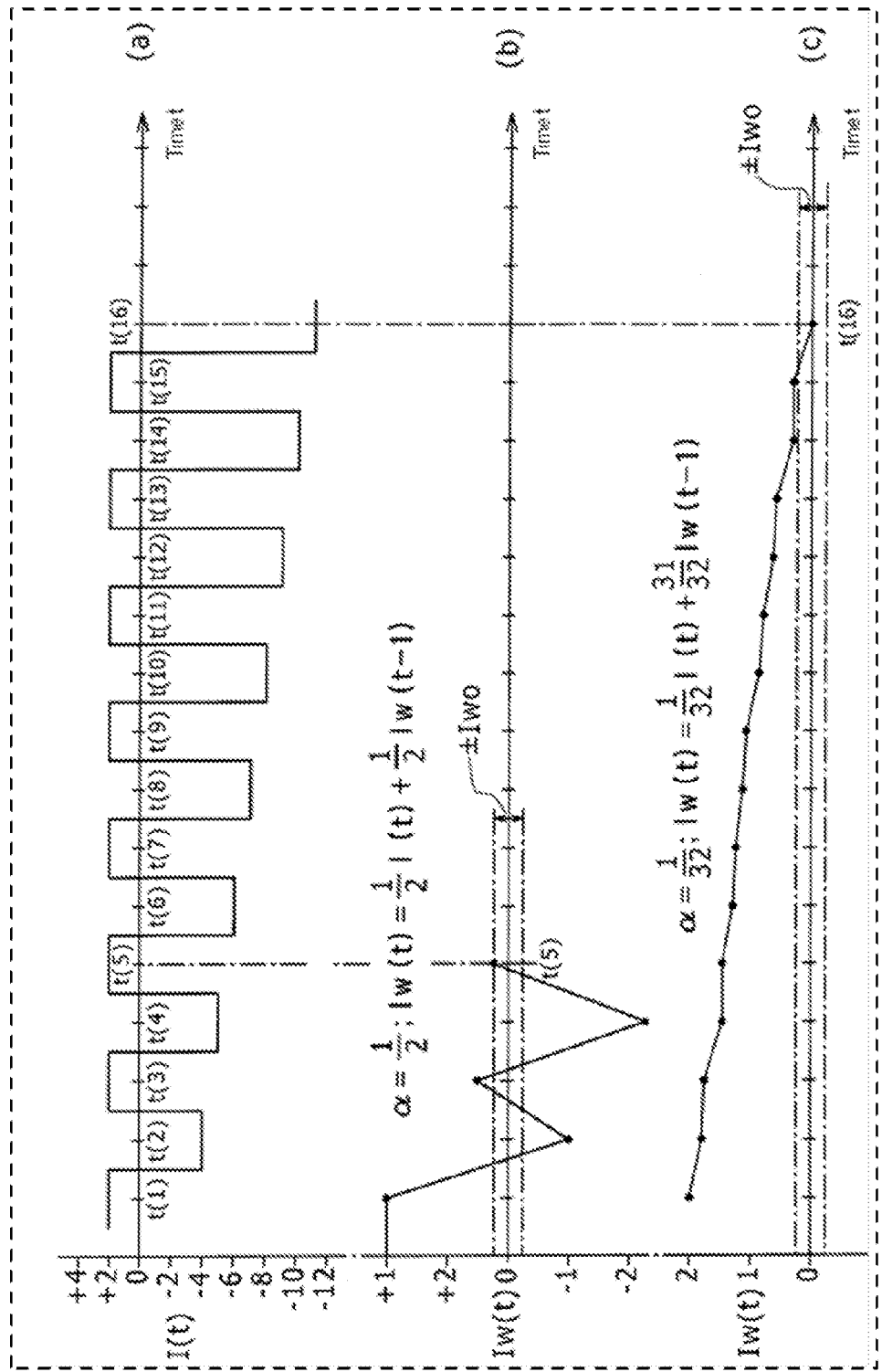
FIG. 3 is a diagram showing a calculation example of a combined current value in the charge state estimation device and method in the example in accordance with the exemplary embodiment of the present invention.
Figure 4:
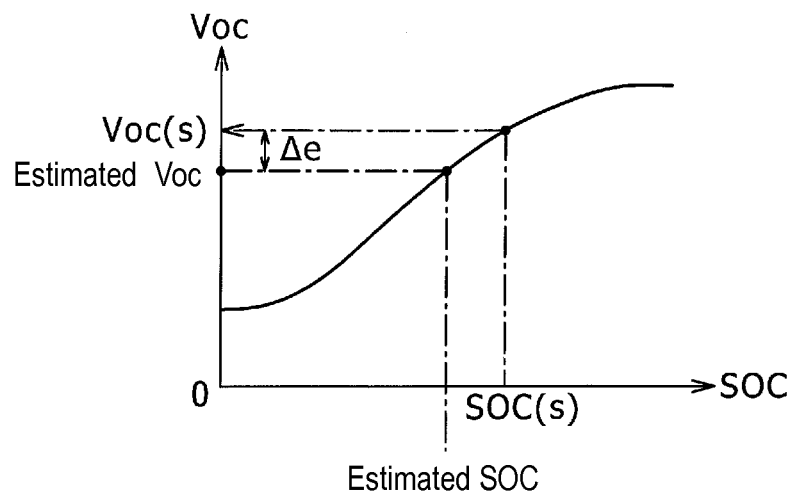
FIG. 4 is a diagram showing an error of a Voc estimated value due to a combination coefficient in a Voc-SOC relation used in the charge state estimation device and method in the example in accordance with the exemplary embodiment of the present invention.
Figure 5:
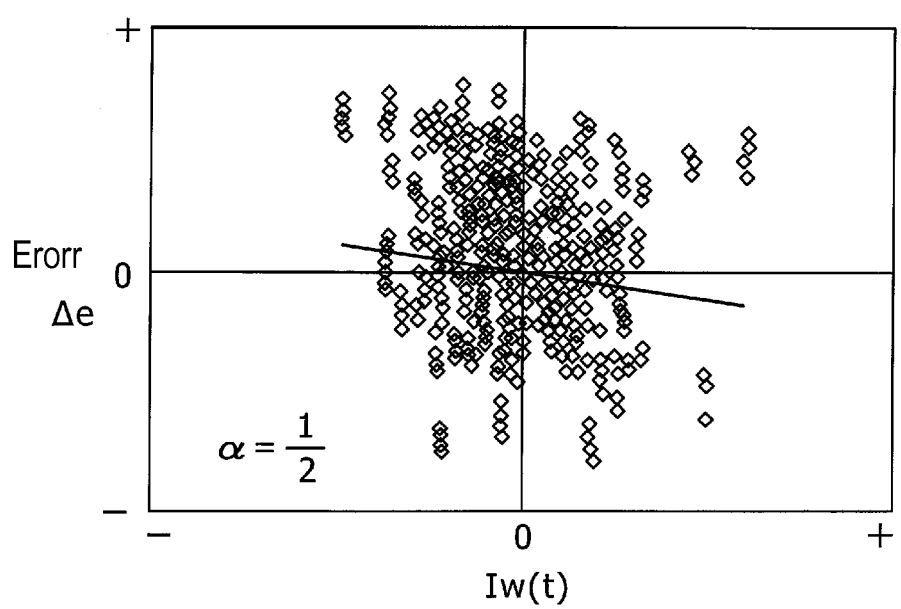
FIG. 5 is a diagram showing the error of the Voc estimated value when the combination coefficient is set at ½ in the charge state estimation device and method in the example in accordance with the exemplary embodiment of the present invention.

The operation of the above-mentioned configuration, especially each function of charge state estimation device 10, is described in detail with reference to FIG. 2 to FIG. 4. FIG. 2 is a flowchart showing the procedures of a charge state estimation method. FIG. 3 is a diagram showing a calculation example of a combined current value. FIG. 4 is a diagram showing an error of the Voc estimated value due to a combination coefficient using the Voc-SOC relation.

The flowchart of FIG. 2 shows the procedures of the charge state estimation method. Each procedure corresponds to each processing procedure of the charge state estimation program. When the charge state estimation program starts up, the charge/discharge current value $I(t)$ and inter-terminal voltage value $V(t)$ of secondary battery 2 are acquired at times t set at a predetermined sampling interval (S1). This processing is executed by the function of current/voltage acquiring unit 13 of charge state estimation device 10.

Next, the combined current value $Iw(t)$ is calculated by a predetermined current combining method from the charge/discharge current value $I(t)$ acquired at a time t in consideration of the charge/discharge state before the time t (S2). This processing is executed by the function of combined current calculating unit 14 of charge state estimation device 10.

The combined current value $Iw(t)$ may be any combined current value as long as the charge/discharge state before the time t is taken into consideration. As one example, a simple average value of charge/discharge current values before the time t can be set as the combined current value Iw(t). As another example, a weighted average value obtained by weighted-averaging a plurality of charge/discharge current values before the time t can be set as the combined current value Iw(t). Furthermore, a weighted sum value obtained by weighting the charge/discharge current values at and before the time t and then adding the weighted values can be set as the combined current value Iw(t).

In this case, as the weighted sum value using combination coefficient α having a value of 0 to 1, the combined current value Iw(t) expressed by equation (1) is used.

[Equation 1]

$$Iw(t)=\alpha I(t)+(1-\alpha)Iw(t-1) \quad (1)$$

FIG. 3 is a diagram showing the calculation of the combined current value Iw(t) from the charge/discharge current value I(t) acquired at a time t. In FIG. 3(a), the horizontal axis shows time, and the vertical axis shows the charge/discharge current value I(t) at the time t. The unit of the vertical axis is ampere (A). Here, the sampling interval for acquiring the charge/discharge current value I(t) is set at 1 s. The origin of the time axis is denoted with t(0), the time after 1 s from t(0) is denoted with t(1), the time after 2 s is denoted with t(2), and, generally, the time after i s is denoted with t(i).

As the charge/discharge current value I(t), charge of +2 A is performed every 2 s and discharge is performed every 2 s between the charges, and the discharge current value is increased in the sequence of −4 A, −5 A, −6 A, and so forth. The sign of the charge/discharge current value is set at + (plus) on the charge side, and at − (minus) on the discharge side. FIG. 3(a) is an example for description of the calculation of the combined current value Iw(t). A charge/discharge current value I(t) that undergoes a variation other than the above-described variation may be employed.

FIG. 3(b) shows the case where combination coefficient α is set at ½ and the charge/discharge current value I(t) is set as shown in FIG. 3(a). The horizontal axis shows time similarly to FIG. 3(a), and the vertical axis shows the combined current value Iw(t) that is calculated using equation (1). The unit of the vertical axis is ampere (A). Here, Iw(0) at t(0) is set at 2 (A). According to FIG. 3(b), when the discharge current value of the charge/discharge current value I(t) is gradually increased as in FIG. 3(a), Iw(t) gradually decreases from initial value Iw(0)=2 (A) while vibrating in the plus and minus directions, and becomes Iw(5)=−0.125 (A) at time t(5).

FIG. 3(c) shows the case where combination coefficient α is set at 1/32 and the charge/discharge current value I(t) is set as shown in FIG. 3(a). The horizontal axis shows time similarly to FIG. 3(a), and the vertical axis shows the combined current value Iw(t) calculated using equation (1). The unit of the vertical axis is ampere (A). Here, Iw(0) at t(0) is set at 2 (A). According to FIG. 3(c), when the discharge current value of the charge/discharge current value I(t) is gradually increased as in FIG. 3(a), Iw(t) gradually decreases from the initial value Iw(0)=2 (A), and becomes Iw(5)=+0.01 (A) at time t(16).

Secondary battery 2 generates an electromotive force and a current by an electrochemical reaction, so that the charge/discharge current value I(t) and inter-terminal voltage value V(t) at the time t are considered to inherit the history of the electrochemical reaction until the time t. Therefore, until a lapse of an appropriate period after occurrence of the electrochemical reaction, the charge state of secondary battery 2 is unstable. In other words, when the current value varies or the charge and discharge are repeated in a short time, setting of the stable time is difficult. Therefore, the timing when the influence of the past history of the charge/discharge state of secondary battery 2 decreases is determined based on whether the combined current value Iw(t) considering the charge/discharge history until the time t converges to a preset value.

The description returns to FIG. 2. When Iw(t) is calculated, it is determined whether the absolute value |Iw(t)| of the calculated Iw(t) becomes predetermined threshold Iw0 or less (S3). The condition where |Iw(t)| becomes the threshold Iw0 or less corresponds to that Iw(t) comes into the range of −Iw0 to +Iw0. The value of the threshold Iw0 is determined based on whether the charge state value SOC of secondary battery 2 can be calculated using a simple equation, and preferably is as small as possible. In the example of FIG. 3, Iw0 is set at 0.2 (A).

Next, the time t=T at which |Iw(t)| becomes the threshold Iw0 or less is set as an estimation time for charge state estimation (S4). This processing is executed by the function of estimation time setting unit 15 of charge state estimation device 10. In other words, the time T is considered as the timing when the charge state value SOC of secondary battery 2 can be calculated relatively easily. The open circuit voltage value Voc of secondary battery 2 is estimated using the charge/discharge current value and inter-terminal voltage of secondary battery 2 at that time, and the charge state value SOC is estimated on the basis of the estimated open circuit voltage value Voc.

The estimation of the open circuit voltage value Voc at the time T, at which |Iw(t)| becomes the predetermined threshold Iw0 or less, is performed on the basis of equation (2). At this time, the inter-terminal voltage value V(T) and charge/discharge current value I(T) at the time T, and the internal resistance value R of secondary battery 2 at the time T are used.

[Equation 2]

$$Voc=V(T)-I(T)\times R \quad (2)$$

The internal resistance value R at the time T is calculated using the inter-terminal voltage value V(T) and charge/discharge current value I(T) at the time T, and the inter-terminal voltage value V(T−n) and charge/discharge current value I(T−n) at a sampling time (T−n) before the time T. Equation (3) shows a calculation example at n=1 (S5). This processing is executed by the function of internal resistance estimating unit 16 of charge state estimation device 10.

[Equation 3]

$$R = \frac{V(T)-V(T-1)}{I(T)-I(T-1)} \quad (3)$$

When the internal resistance value R at the time T is calculated using equation (3), the open circuit voltage value Voc at the time T can be calculated on the basis of equation (2) using the internal resistance value R. When the open circuit voltage value Voc is calculated, the charge state value SOC is estimated (S6). This processing is executed by the function of charge state estimating unit 17 of charge state estimation device 10.

The estimation of the charge state value SOC from the open circuit voltage value Voc is performed on the basis of the Voc-SOC relation showing the relationship between the previously determined open circuit voltage value Voc and charge state value SOC.

FIG. 4 is a diagram showing an example of the Voc-SOC relation. The Voc-SOC relation is shown by a map where the horizontal axis shows SOC and the vertical axis shows Voc. When the specification of secondary battery 2 has been determined, this map can be obtained by an experiment. In other words, SOC is determined by a current integrating method, in which the charge current value and discharge current value of secondary battery 2 are momentarily integrated. In this state, the inter-terminal voltage of secondary battery 2 obtained when the charge and discharge are stopped is set at Voc. When Voc is determined in response to the variation in SOC, the map as in FIG. 4 can be acquired.

The Voc-SOC relation can be determined by the current integrating method in the initial state, namely the state when secondary battery 2 is manufactured and shipped. The maximum capacity of secondary battery 2 is determined, so that secondary battery 2 cannot be charged beyond it. This state is set as a full charge state, and the charge state value SOC in this state is 100%. For example, it is assumed that secondary battery 2 is formed by interconnecting, in parallel, 10 battery blocks each of which is formed by interconnecting 100 lithium-ion cells in series. In the initial state of secondary battery 2, the open circuit voltage value Voc is 400 V and the full charge capacity is 29 Ah, and full charge capacity=29 Ah corresponds to charge state value SOC=100%. This numerical value is an example for description, and another state may be set as full charge.

When secondary battery 2 is repeatedly charged and discharged from the initial state, the full charge capacity decreases. Even when secondary battery 2 is charged to the upper-limit voltage, for example, the charge capacity decreases to about 20 Ah. This capacity of 20 Ah is the full charge capacity after the start of an operation of secondary battery 2, and the charge state value SOC of secondary battery 2 after the start of the operation is calculated under the condition where the state of 20 Ah indicates SOC=100%. Thus, the full charge capacity of charge state value SOC=100% varies depending on the operation state of secondary battery 2. For distinction, the battery state SOH is used. Here, SOH=100% corresponds to the state of the full charge capacity in the initial state of secondary battery 2, and, in the above-mentioned example, corresponds to the charge capacity=29 Ah. When the full charge capacity of secondary battery 2 decreases to 20 Ah after the start of the operation, the state of charge capacity=20 Ah corresponds to charge state value SOC=100% after the start of the operation and corresponds to SOH=(20 Ah/29 Ah)×100%=69%.

Thus, the full charge capacity decreases when secondary battery 2 is repeatedly charged and discharged. Therefore, the Voc-SOC relation after the start of the charge/discharge operation is different from the initial Voc-SOC relation. Preferably, the charge/discharge operation conditions secondary battery 2 are made the same, and the Voc-SOC relation is prepared for each of the same charge/discharge operation conditions. Practically, however, the charge/discharge operation condition of secondary battery 2 depends on the requests from charge power source 6 and discharge load 7, and hence it is difficult to use the same condition. Hereinafter, unless otherwise specifically noted, the charge state value SOC is a value estimated using the initial Voc-SOC relation.

The Voc-SOC relation is stored in an appropriate memory of charge state estimation device 10, and can be read out during the processing of S6. The Voc-SOC relation may correspond to secondary battery 2, or may correspond to cells constituting secondary battery 2. In the latter case, the Voc-SOC relation of secondary battery 2 can be obtained by multiplying the number of cells constituting secondary battery 2 by the Voc-SOC relation of the cells. The Voc-SOC relation of a lithium-ion cell depends on the shape or specification of the cell, so that it is preferable that the Voc-SOC relation corresponding to the type of a used lithium-ion cell is stored.

FIG. 4 describes the Voc-SOC relation using a map, but a pattern other than the map may be used as long as the remaining parameter is read using one of the open circuit voltage value Voc and charge state value SOC as a search key. For example, a pattern such as a look-up table or an equation allowing reading of the charge state value SOC using the open circuit voltage value Voc as a search key. Alternatively, a read only memory (ROM) pattern for receiving the open circuit voltage value Voc and outputting the charge state value SOC may be employed. Conversely, the open circuit voltage value Voc may be read out or output using the input charge state value SOC as a search key.

The following case is described:
secondary battery 2 is formed by interconnecting, in parallel, 10 battery blocks each of which is formed by interconnecting 100 lithium-ion cells in series; and
t(16) is set as the estimation time T using FIG. 3(c).

At this time, it is assumed that the inter-terminal voltage value V(T) is 380 V and the discharge current value I(T) is −11 A at the estimation time T, and the inter-terminal voltage value V(T−n) is 382 V and the charge current value I(T−n) is +2 A at a time (T−n) before the time T. Using equation (3), internal resistance value R={(380 V−382 V)/(−11 A−2 A)}={(−2 V)/(−13 A)}=0.15Ω is derived. Using equation (2), open circuit voltage value Voc=380 V−(−11 A)×0.15 Ω=380 V+1.65 V=381.65 V is derived. By associating these values with the Voc-SOC relation of FIG. 4, charge state value SOC=70% can be estimated. Charge state value SOC=70% is estimated on the basis of the assumption that the full charge state of secondary battery 2 indicates SOC=100%. These numerical values are an example for description, and other numerical values may be employed.

The description returns to FIG. 2 again. When the SOC estimation is performed, SOH and the remaining capacity in the charge/discharge operation are estimated on a case-by-case basis (S7). The estimation of SOH and the remaining capacity can be performed as below.

FIG. 3 shows the example where the charge current value is +2 A and the discharge current value has a gradually increasing current pattern. However, another current pattern can be generated in the actual operation. In such a case, for another Voc determined using the processing of S1 to S6, the charge state value SOC can be determined using the Voc-SOC relation of FIG. 4.

The charge state value SOC determined in this manner is assumed to be 80%. While, the current value from the previous estimation timing of SOC (=70%) to the next estimation timing of SOC (=80%) can be integrated by current integrating unit 18, and the integrated current value during the SOC estimation can be obtained. For example, the integrated current value at this time is assumed to be 2.8 Ah.

The description returns to FIG. 2 again. For estimating the battery state value SOH, the estimation timings of a plurality of SOCs and the integrated current value between the timings are used. In this example, SOC=70% and SOC=80% are estimated and the integrated current value between them is 2.8 Ah, so that the battery capacity is 2.8 Ah/(80%−70%)= 28 Ah and the battery state value SOH is 28 Ah/29

Ah=97%. When SOC is 80% at this time, the remaining capacity is 28 Ah×80%=22.4 Ah.

Thus, when data of the charge state value SOC, SOH, and the remaining capacity has been obtained for each of different charge/discharge operation states,—for example, different operation times—, a capacity variation value from the initial charge state value SOC of secondary battery 2 can be estimated on the basis of the data. By this estimation, the battery state value SOH is calculated as a capacity maintaining rate. This processing is executed by the function of battery state estimating unit 19 of charge state estimation device 10.

Thus, a time when the combined current value |Iw(t)| using combination coefficient α is the threshold Iw0 or less is set as the estimation time T, and Voc, SOC, SOH, and remaining capacity can be estimated on the basis of the inter-terminal voltage value and charge/discharge current value at this time.

The description returns to FIG. 3. According to the comparison between FIG. 3(b) and FIG. 3(c), the combined current value Iw(t) calculated using smaller combination coefficient α includes a longer-term charge/discharge history until the time t. Secondary battery 2 generates an electromotive force and current by electrochemical reaction, so that the charge/discharge current value I(t) and inter-terminal voltage value V(t) at the time t are considered to inherit the history of the electrochemical reaction until the time t. Therefore, until a lapse of an appropriate period after occurrence of the electrochemical reaction, the charge state of secondary battery 2 is unstable. Therefore, the influence of the past charge/discharge history is determined using the combined current value Iw(t) considering the past charge/discharge history. When the influence of the history is small, the open circuit voltage value Voc can be calculated using a relatively simple equation.

In the case of α=½ in FIG. 3(b), Iw(t) becomes significantly small at a time t(5), but Iw(t) until then is directly affected by the charge and discharge every 1 s, and Iw(t) greatly vibrates in the plus and minus directions. Therefore, it is considered that the charge state of secondary battery 2 at the time t(5) is greatly affected by the past charge/discharge history. While, in the case of α=1/32 in FIG. 3(c), Iw(t) becomes significantly small at a time t(16), and also Iw(t) gradually decreases until the time t(16). Therefore, it is considered that the charge state of secondary battery 2 at the time t(16) is hardly affected by the past charge/discharge history.

Thus, it is expected that the magnitude of the error of the estimated value of Voc depends on combination coefficient α. Preferably, by previously performing a charge/discharge experiment for each type of cell, combination coefficient α is set so that the error as the difference between the estimated value and the true value is small.

Of some combination coefficient candidates, the combination coefficient candidate having a minimum error is set as a minimum-error combination coefficient. This setting of the combination coefficient can be performed as below.

First, the charge state value SOC(S) is calculated based on the current integrating method by sequentially integrating the charge/discharge current value until the estimation time T. Next, using the Voc-SOC relation described in FIG. 4, the open circuit voltage value Voc(S) corresponding to the charge state value SOC(S) is calculated. FIG. 4 shows the charge state value SOC(S) based on the current integrating method and the open circuit voltage value Voc(S) corresponding to it.

Then, using the procedure described in FIG. 4 and the procedure described in FIG. 3, for each of the some combination coefficient candidates, an estimation time T is set and an open circuit voltage value Voc is calculated. The calculated open circuit voltage value Voc is set as a calculated voltage value candidate Voc(A). In the example in FIG. 3, combination coefficient candidates α are ½ and 1/32 and respective estimation times T are t(5) and t(16).

Next, errors Δe between respective calculated voltage value candidates Voc(A) and the open circuit voltage value Voc(S) obtained by the current integrating method are compared with each other. FIG. 4 shows estimated Voc corresponding to estimated SOC when combination coefficient α is 1/32. The estimated Voc is the calculated voltage value candidate Voc(A) for combination coefficient α=1/32. Error Δe is voltage difference between Voc(S) and the estimated Voc.

FIG. 5 to FIG. 8 are diagrams showing the relationships between error Δe and the combined current value Iw(t). The relationships are obtained from various current patterns for combination coefficients α of ½, 1/32, 1/64, and 1/128. In these drawings, the horizontal axis shows Iw(t) and the vertical axis shows error Δe of the estimated Voc.

Ideally, error Δe is 0 when Iw(t) is 0, and it is considered that error Δe increases as Iw(t) separates from 0 and hence the magnitude of Iw(t) increases. FIG. 5 to FIG. 8 are compared with each other on the basis of this viewpoint. In the case of α=½, error Δe disperses regardless of Iw(t). This is considered to be because error Δe is greatly affected by the variation in the charge/discharge current value and hence error Δe is apt to increase even for Iw(t)=0. The following tendency becomes clear. When α is decreased in the sequence of 1/32, 1/64, and 1/128, error Δe at Iw(t)=0 decreases. As Iw(t) separates from 0 and hence the magnitude of Iw(t) increases, error Δe increases.

The cases of α=1/32, α=1/64, and α=1/128 are compared with each other, error Δe for variation in Iw(t) is the smallest when α is 1/32. Therefore, α=1/32 can be set as the minimum-error combination coefficient having the smallest error.

Combination coefficient α is a coefficient that indicates the degree of taking the charge/discharge history until the time t into consideration when the combined current value Iw(t) is calculated. Therefore, the value of the minimum-error combination coefficient is considered to depend on the contents of the electrochemical reaction during the charge or discharge of secondary battery 2. FIG. 5 to FIG. 8 are applicable to evaluated secondary battery 2, but the minimum-error combination coefficient varies depending on the specification of secondary battery 2. Therefore, preferably, after the specification of secondary battery 2 is determined, the processing of setting the minimum-error combination coefficient is performed, and Voc, SOC, SOH, and remaining capacity are estimated using the set minimum-error combination coefficient.

Figure 6:
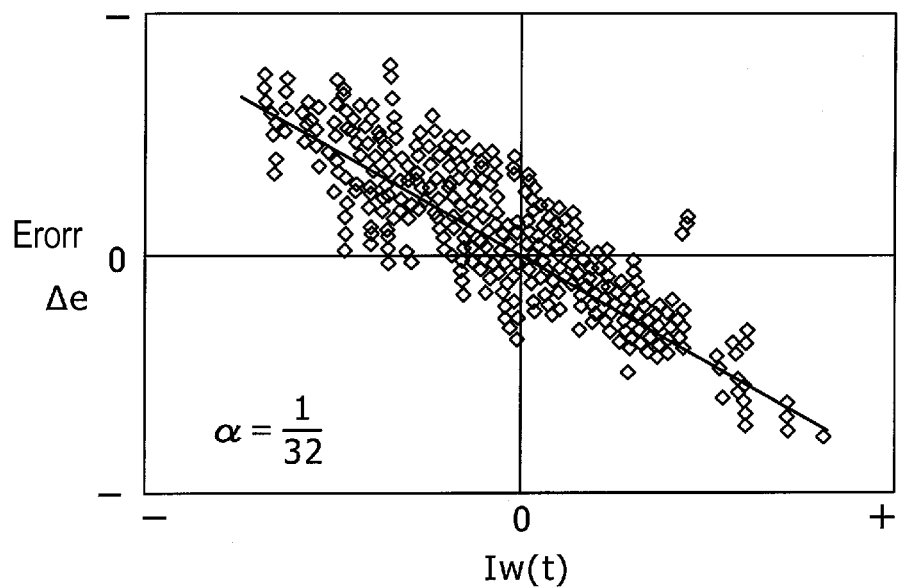
FIG. 6 is a diagram showing the error of the Voc estimated value when the combination coefficient is set at 1/32 in the charge state estimation device and method in the example in accordance with the exemplary embodiment of the present invention.
Figure 7:
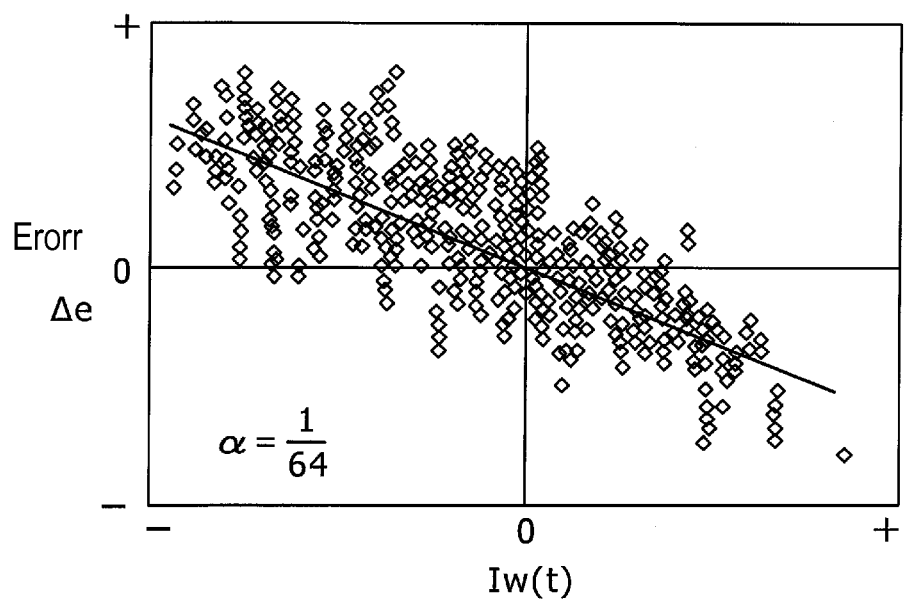
FIG. 7 is a diagram showing the error of the Voc estimated value when the combination coefficient is set at 1/64 in the charge state estimation device and method in the example in accordance with the exemplary embodiment of the present invention.
Figure 8:
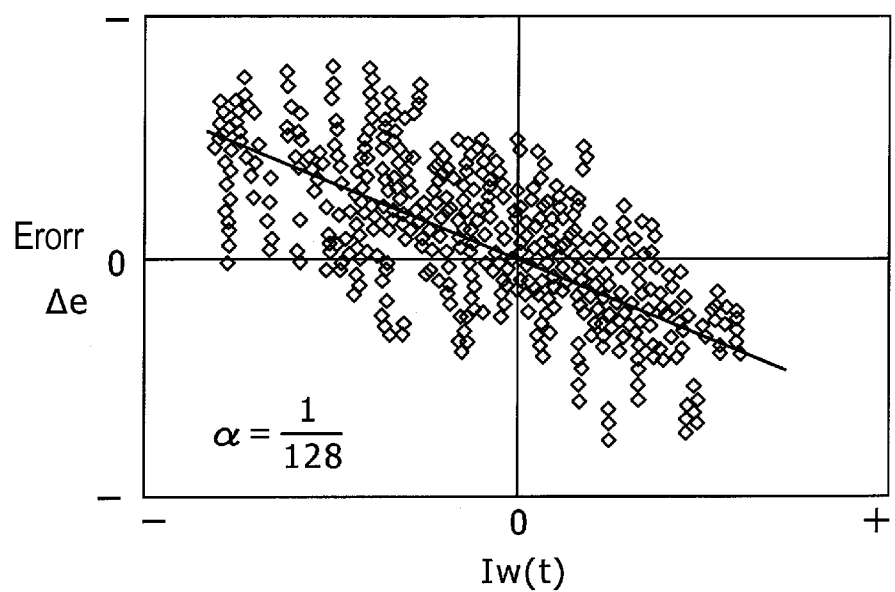
FIG. 8 is a diagram showing the error of the Voc estimated value when the combination coefficient is set at 1/128 in the charge state estimation device and method in the example in accordance with the exemplary embodiment of the present invention.

When the distribution of the error has a tendency as shown in FIG. 6 to FIG. 8, and the relationship between Iw(t) and error Δe can be approximated using a linear line or a curved line expressed by another function, the calculated value of Voc may be corrected in accordance with the value of the combined current value Iw(t) for estimating SOC.

The values of SOC and SOH acquired using the method described in the present invention may be updated to the latest values, when the values are displayed in accordance with the condition such as the time just after the estimation, the periodic updating timing, or the user's operation. These values may be incorporated into a device including a display interface for notifying a user of the remaining capacity and capacity maintaining rate.

When the setting of the minimum-error combination coefficient is affected by the temperature, SOC, and SOH, a plurality of combination coefficients α are held in accordance with the condition, and the coefficients may be selectively used in accordance with the operation condition of charge/discharge system 1.

REFERENCE MARKS IN THE DRAWINGS

1 charge/discharge system (of secondary battery)
2 secondary battery
3 current detecting unit
4 voltage detecting unit
5 charge/discharge control unit
6 charge power source
7 discharge load
10 charge state estimation device (of secondary battery)
11 charge/discharge current waveform
12 inter-terminal voltage waveform
13 current/voltage acquiring unit
14 combined current calculating unit
15 estimation time setting unit
16 internal resistance estimating unit
17 charge state estimating unit
18 current integrating unit
19 battery state estimating unit

The invention claimed is:

1. A charge state estimation device of a secondary battery for estimating a charge state value SOC of the secondary battery repeatedly charged and discharged in a short time, the charge state estimation device comprising:
   a current/voltage acquiring unit for acquiring a charge or discharge current value and an inter-terminal voltage value of the secondary battery at a predetermined sampling time interval;
   a combined current calculating unit for calculating, by a predetermined current combining method, a combined current value Iw(t) from the charge or discharge current value I(t) acquired at a time t in consideration of a charge or discharge state before the time t;
   an estimation time setting unit for setting, as an estimation time for charge state estimation, a time t=T at which the combined current value Iw(t) exists within a predetermined threshold range;
   an internal resistance estimating unit for estimating an internal resistance value R of the secondary battery based on the inter-terminal voltage value V(T) and the charge or discharge current value I(T) of the secondary battery at the estimation time T and the inter-terminal voltage value V(T−n) and the charge or discharge current value I(T−n) of the secondary battery at a sampling time (T−n) before the estimation time T, the n being a natural number of 1 or more; and
   a charge state estimating unit for estimating an open circuit voltage value Voc of the secondary battery based on the inter-terminal voltage value V(T) of the secondary battery at the estimation time T and the internal resistance value R, and estimating the charge state value SOC of the secondary battery based on a Voc-SOC relation showing a relationship between the previously determined open circuit voltage value Voc and the charge state value SOC.

2. The charge state estimation device of the secondary battery according to claim 1, wherein
   the combined current calculating unit calculates the combined current value from Iw(t)=αI(t)+(1−α)Iw(T−n) using a predetermined combination coefficient α, the Iw(t) shows the combined current value at the time t, and the Iw(T−n) shows the combined current value at the sampling time (T−n) before the estimation time T.

3. The charge state estimation device of the secondary battery according to claim 2, wherein
   the combination coefficient α is set based on a charge or discharge characteristic of the secondary battery.

4. The charge state estimation device of the secondary battery according to claim 1, further comprising
   a capacity variation estimating unit for estimating a capacity variation value from a charge or discharge state value in an initial state of the secondary battery based on the plurality of charge state values SOC at different charge or discharge operation times.

* * * * *